United States Patent [19]

Takagai et al.

[11] Patent Number: 4,910,482
[45] Date of Patent: Mar. 20, 1990

[54] AC LINE FILTER

[75] Inventors: Kusuo Takagai; Yuuzaburo Inoue, both of Tokyo, Japan

[73] Assignee: Nippon Telegraph and Telephone Corporation and Sanritsu Electric Company, Tokyo, Japan

[21] Appl. No.: 246,854

[22] Filed: Sep. 20, 1988

[30] Foreign Application Priority Data

Feb. 29, 1988 [JP] Japan .................. 63-44200

[51] Int. Cl.⁴ .............................................. H03H 7/09
[52] U.S. Cl. ........................................ 333/181; 333/12; 333/177; 333/185; 336/212; 336/165; 336/184
[58] Field of Search ............... 333/167, 181, 177, 179, 333/172; 336/155, 160, 165, 212, 184, 211; 323/361, 253, 215, 323, 325

[56] References Cited

U.S. PATENT DOCUMENTS 2,771,587  11/1956  Henderson ............... 336/212 X
4,172,244  10/1979  Zeis ........................ 323/361 X
4,177,418  12/1979  Brueckner et al. ........ 336/160 X
4,725,739   2/1988  McCartney et al. ...... 333/167 X
4,761,623   8/1988  Schneider ................. 333/167
4,768,002   8/1988  Cronin ..................... 333/181 X
4,835,497   5/1989  Takagi et al. ............. 333/177

*Primary Examiner*—Eugene R. Laroche
*Assistant Examiner*—Seung Ham
*Attorney, Agent, or Firm*—Lowe, Price, LeBlanc, Becker & Shur

[57] ABSTRACT

An AC line filter in which a pair of windings are wound in an opposite direction to each other and are provided at opposing locations on a main core that forms a closed magnetic path. At least one auxiliary core which forms a shorter magnetic path than the main core is positioned adjacent the main core. The auxiliary core has at low frequency region an effective permeability higher than that of the main core. A portion of each of the pair of windings being provided in such a way that the portion is a concentrated winding which surrounds both the main core and the auxiliary core simultaneously.

7 Claims, 11 Drawing Sheets

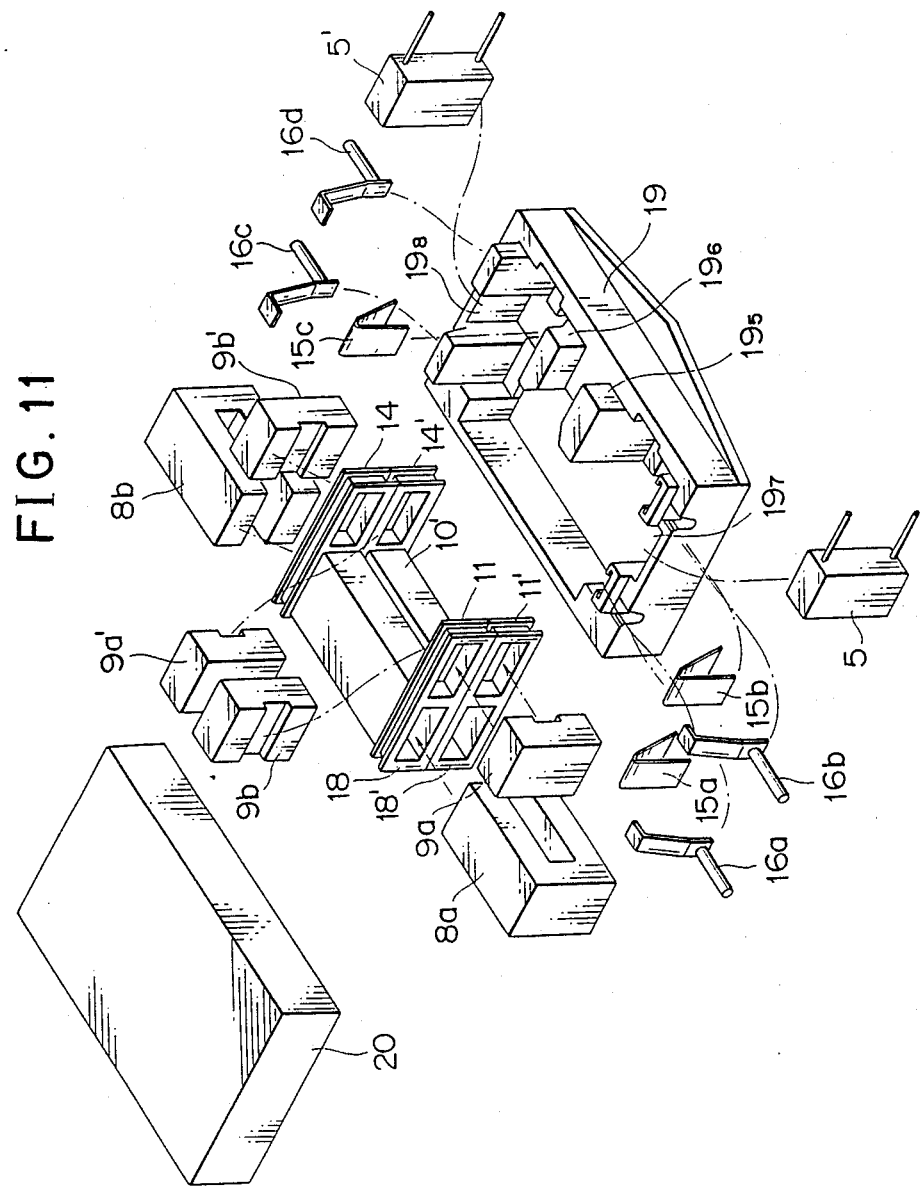

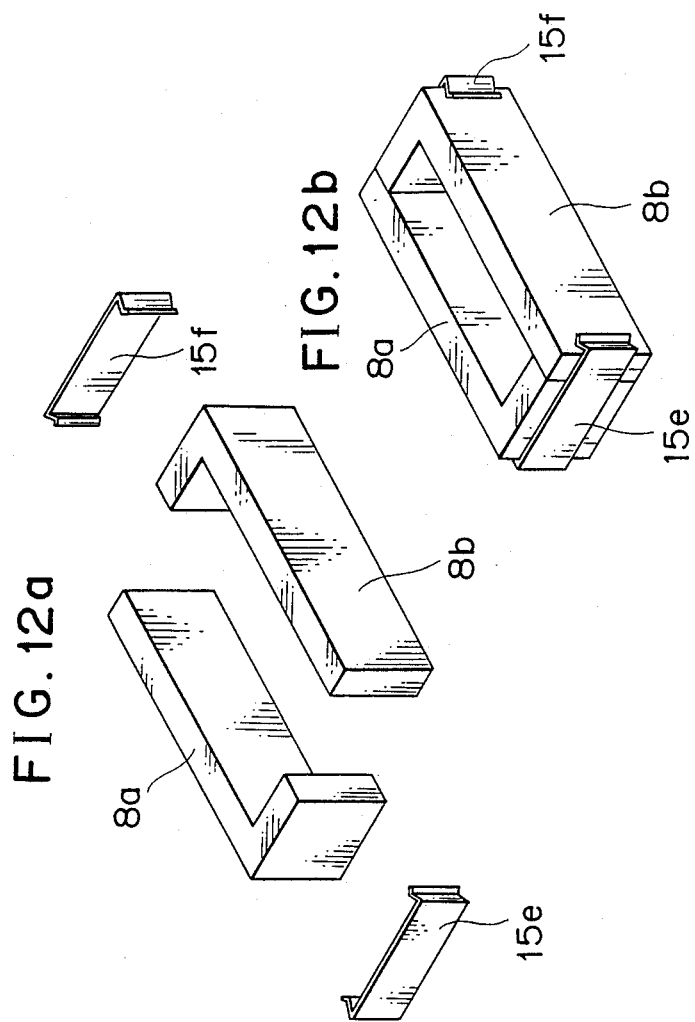

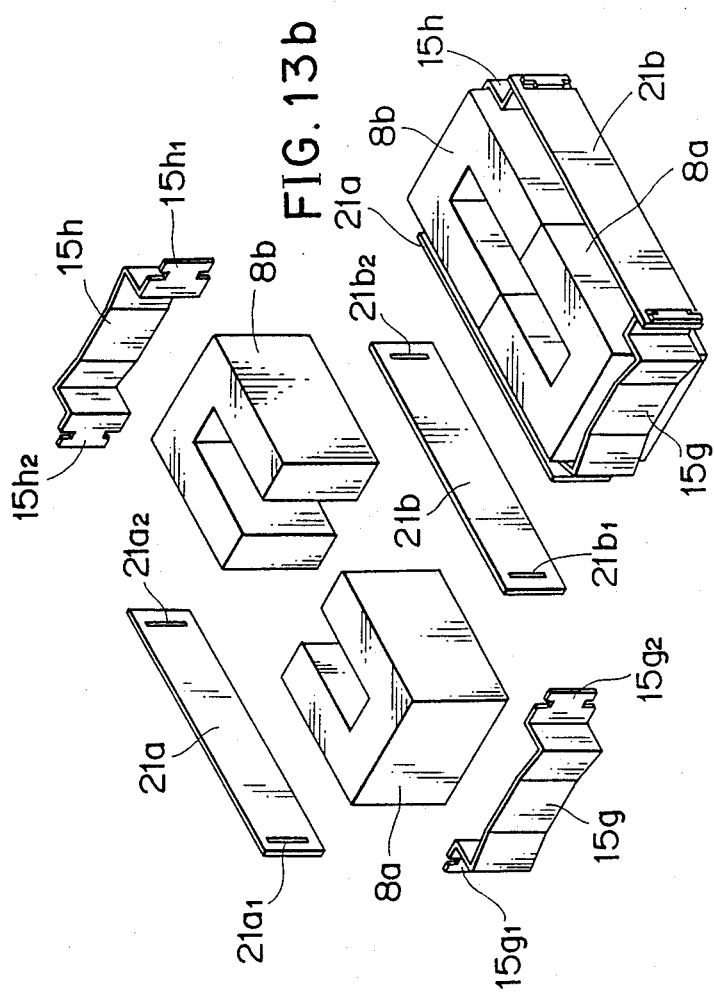

AC LINE FILTER

BACKGROUND OF THE INVENTION

1. Field of of the Invention

The present invention relates to an ac line filter which rejects high frequency common mode noise and normal mode noise over a wide frequency band, and is particularly useful for rejecting noise of about 40 MHz which is induced in commercial power lines from high frequency equipments such as a high frequency welder and comes into electronic equipments concerned, and for rejecting radiated low frequency noise of about 0.1 to several tens MHz which leak into the ac line from equipments such as a switching power supply.

2. Description of Prior Art

This type of conventional ac line filters have been of a type, for example, shown in FIG. 15 in which windings are provided on a closed circular magnetic path.

In FIG. 15 and FIG. 16 depicting the equivalent circuit of FIG. 15, the ac line filter has a pair of windings 4, 4' connected to terminals 1,1' and 2,2'. These Figures show that a load is connected to the terminals 1,1' and the ac line P is connected to the terminals 2,2', where the load L and ac line P may be interchanged. A core 3 as a closed circular magnetic path has effective permeability higher than a certain value across a frequency band, from a low frequency region to a desired high frequency region. The windings 4, 4' are wound in opposite direction to each other so that a common mode curent of a high frequency which flows into the terminals 1,1' or 2,2' causes a magnetic flux of the same direction. Capacitors 5,5' bypass a normal mode current of high frequencies in opposite phase flowing into the terminals 1,1' or 2,2'. Capacitors Cg bypass the high frequency common mode current flowing into the terminals 1,1' or 2,2' to the ground through a ground terminal 7. Capacitances Cs are stray capacitances between the input terminals and the output terminals of the respective windings 4,4'. Characteristics of rejecting the high frequency common mode noise current of a prior art ac line filter thus arranged is primarily governed by resonance characteristics of the bypass capacitors Cg and an inductance L+M (actually L+M is nearly equal to 2L) which is a sum of self inductances L of the respecive windings 4,4' and the mutual inductance M therebetween. However, when grounding effect of the ground terminal 7 is poor or the ground terminal 7 is not grounded, the aforementioned effect of the bypass capacitors Cg is lost and the noise rejection characteristics is solely dependent on the aforementioned inductances only.

The self inductances of the windings on the closed circular magnetic core described above is expressed by an equation $L = \mu S N^2 / l$ where $\mu$ is permeability of the core, S the cross-sectional area of the core, N the turns of the windings and l the average length of the magnetic path. Thus if the inductance is to be made large to improve noise rejection characteristics, the number of turns N is usually increased because overall dimension of the filter is limited.

However, increasing the number of turns causes not only increased distributed capacitance of the windings but also stray capacitances Cs between the input and output terminals due to the fact that the closed magnetic path is a circular core, thereby deteriorating high frequency noise rejection characteristics.

Thus if the conventional ac line filter is used with the ground terminal not being grounded, then it will exhibit a poor noise rejection characteristics at high frequencies because the bypass capacitor is no longer effective. Further, even when the ground terminal is grounded, the filter still has the same problem that increasing the number of turns causes increasing stray capacitance Cs between the input and output terminals of the respective windings on a circular magnetic core, which stray capacitances Cg cause a poor high frequency characteristics.

SUMMARY OF THE INVENTION

FIG. 1 shows a principle embodiment of an ac line filter according to the present invention. A pair of windings 4,4' are wound in a direction opposite to each other at opposing locations on a core 8 which forms a closed magnetic path. Disposed adjacent the core 8 is an auxiliary core 9 having a shorter magnetic path than the core 8 and having higher effective permeability as compared to the core 8 at a low frequency region. Portions 11,11' of the above windings 4,4' are concentrated around both the core 8 and the auxiliary core 9, which act as cores common to the portions 11 and 11' respectively. Additionally, capacitors 5, 5' may be connected between the terminals 1 and 1', and between terminals 2 and 2', which terminals 1,1',2,2' correspond to the aforementioned respective windings 4,4'. A series circuit of two bypass capacitors Cg1 and Cg2 may also be connected across the ac line side of the filter with the mid point of the Cg1 and Cg2 being grounded.

FIG. 2 is a diagram for illustrating operation of the ac line filter when a common mode noise current Nc of in-phase flows into the filter from the terminals 1 and 1'. FIG. 3 is a diagram for illustrating operation of the ac line filter when currents of out-of-phase such as a normal ac current or a normal mode current S flows into the filter from the terminals 1 and 1'. Operation of the principle embodiment in FIG. 1 will now be described with reference to FIG. 2 and FIG. 3. Like elements have been given like reference numerals in these drawings.

In FIG. 2, when the in-phase common mode noise flows into the terminals 1, 1', magnetic flux $\phi 1N$, $\phi 2N$, $\phi 3N$ generated within the core 8 by three portions 10, 11, 12 which form part of the winding 4, are oriented in the same direction as that of magnetic flux $\phi'1N$, $\phi'2N$, $\phi'3N$ generated by three portions 10', 11', 12' which form part of the winding 4'. The direction of the respective magnetic flux are depicted by arrows in FIG. 2. Thus these flux intensify the magnetic field strength each other to exhibit a high inductance against the common mode noise current Nc.

On the other hand, when the normal mode ac current S flows into the coil winding through the terminals 1, 1', magnetic flux $\phi 1S$, $\phi 2S$, $\phi 3S$ generated within the core 8 by three portions 10, 11, 12 which form part of the winding 4 are oriented in a direction opposite to that of magnetic flux $\phi'1S$, $\phi'2S$, $\phi'3S$ generated by three portions 10', 11', 12' which form part of the winding 4'. The direction of the respective magnetic flux are shown by arrows in FIG. 2. Thus these flux cancel each other to show a small inductance against the normal mode ac current.

With the concentrated-winding portions 11, 11' which are wound around both the auxiliary core 9 and the core 8 according to the present invention, the winding portions 11, 11' show particularly large inductances at the low frequency region to improve low frequency noise rejection characteristics since effective permeability of the auxiliary core 9 in the low frequency region is particularly higher than that of the core 8. Also, the other winding portions 10, 10' and 12, 12' in section 11, 13 may be arranged in spaced-writing since the windings 11, 11' that occupy section 12 are wound in concentrated manner. Thus the distributed capacitances of these winding portions 10, 10' and 12, 12' and stray capacitances between the terminals may be decreased.

FIG. 5 shows an equivalent circuit of the principle embodiment, which shows the distributed capacitances C1, C2, C3 and the stray capacitances C'1, C'2, C'3 between the terminals corresponding to the respecive windings. Although the concentrated windings 11, 11' increase the distributed capacitances C2, C'2 thereof, the windings 10,10' and 12,12' decrease the distributed capacitances thereof, connected in series with these capacitances C2, C'2, and stray capacitances between the terminals. The resultant capacitance between the terminals 1 and 2 and that of between the terminals 1' and 2' decrease markedly, thereby the frequency characteristics also being improved in the high frequency region.

Arranging the windings 10, 10', 12, and 12' in large winding sections 11, and 13 as compared to the section 12 can provide further decreased capacitances C1 and C3.

Also the total capacitance between the terminals 1 and 1' and the terminals 2 and 2' is a series resultant capacitance of these capacitances C1, C2, C3 and is primarily determined by the capacitance C1 and C3. Thus a large value of the capacitance C2 resulted from the concentrated windings of 11, 11' does not affect the characteristics at the high frequency region. In the case where the closed magnetic path is arranged in the form of a rectangle as in the principle embodiment, leakage flux increases in the low frequency region but the auxiliary core of the windings 11 and 11' causes inductance to increase at much higher rate, providing good impedance characteristics in the low frequency region as well. Consequently, the present invention can implement a good impedance characteristics in both the high frequency region and the low frequency region, thereby providing noise rejection characteristics of the filter over a wide frequency band.

BRIEF DESCRIPTION OF THE DRAWINGS

FIG. 11 is an exploded perspective view of the specific model in FIG. 10;

FIG. 12 and FIG. 13 are diagrams showing means to form a core of a rectangular closed magnetic path;

PREFERRED EMBODIMENTS OF THE INVENTION

The principle embodiment thus far mentioned will now be described in greater detail as follows.

Figure 1:
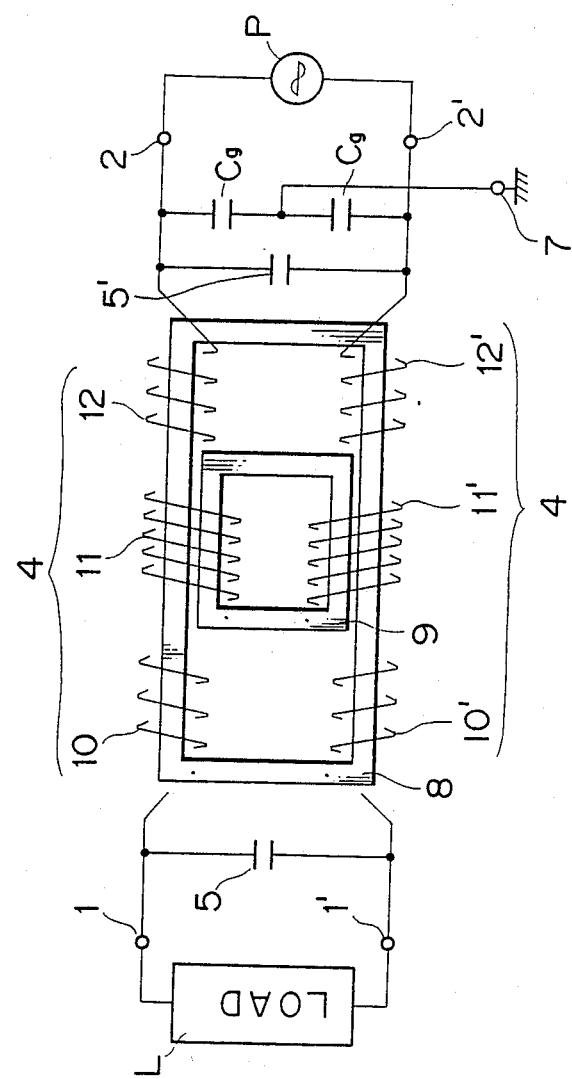
FIG. 1 shows a principle embodiment of an ac line filter in which a core of a rectangular closed magnetic path is used.
Figure 2:
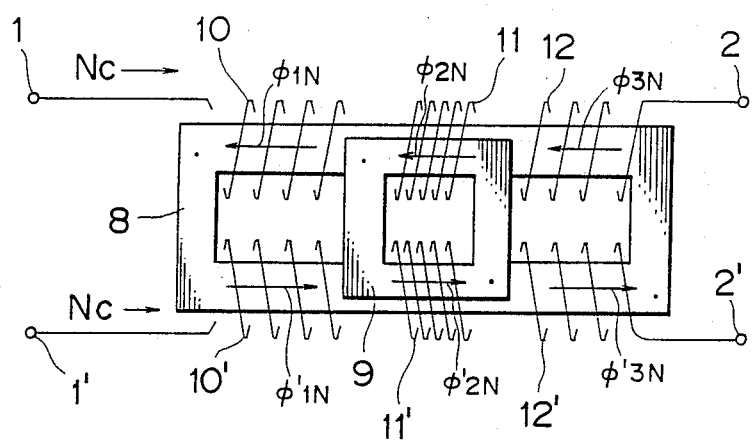
FIG. 2 and FIG. 3 are diagrams illustrating the principle operation of the embodiment in FIG. 1.
Figure 3:
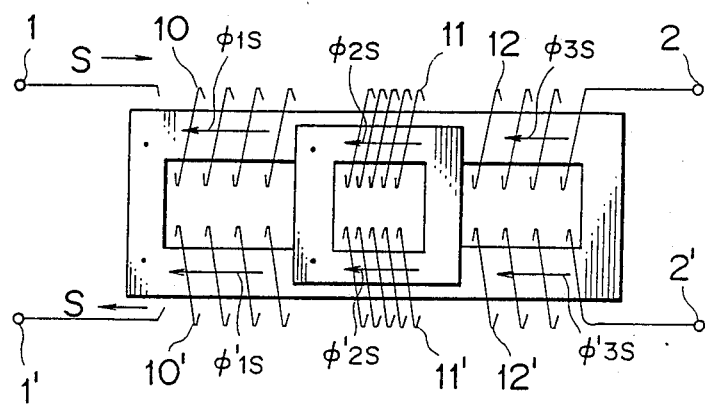
Figure 4:
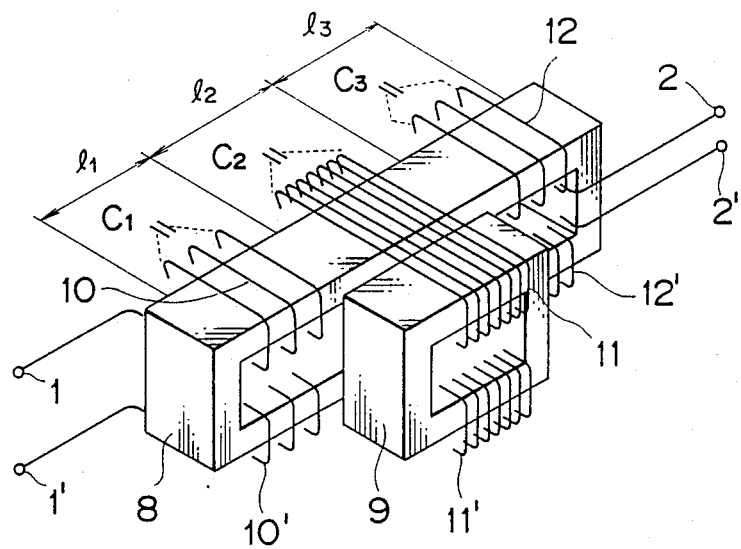
FIG. 4 is a perspective view of the principle embodiment in FIG. 1.
Figure 5:
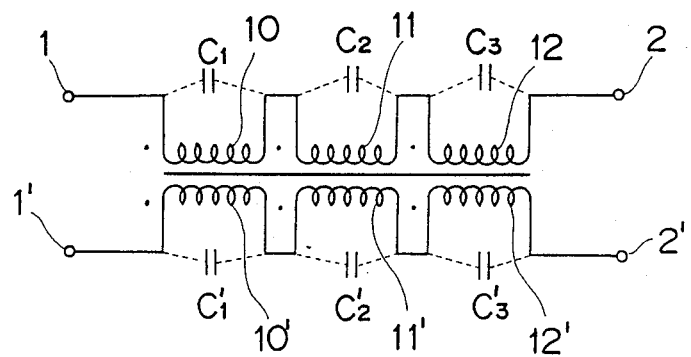
FIG. 5 is an equivalent circuit of the principle embodiment in FIG. 4.

In a perspective view depicted in FIG. 4 cited previously, the main core 8 is to form a rectangular closed magnetic path having effective permeability higher than a certain value up to a desired high frequency region. The auxiliary core is to form a rectangular closed magnetic path having effective permeability substantially equal to or higher than that of the main core at a low frequency region. The windings 10, 10' and 12, 12' are wound around portions 11 and 13 of the long sides of the main core at locations opposing each other. The windings 11, 11' are wound at a portion 12 of the long side of the main core around both the main core and a portion of the closed core of a auxiliary core 9 simultaneously.

These two windings 11, 11' are wound around these cores 8,9 at opposing locations in single-layer or multi-layer in a manner of a close and concentrated winding. The windings 10,11' and 12, 12' are wound with more space between the adjacent turns than the windings 11,11'.

These windings 10, 12, and 11 are wound so that when a common mode current flows into the filter through the terminals 1,1' or 2,2', the windings provide magnetic flux within the main core and the auxilairy core in the same direction as that provided by the windings 10', 12', and 11'.

Figure 6:
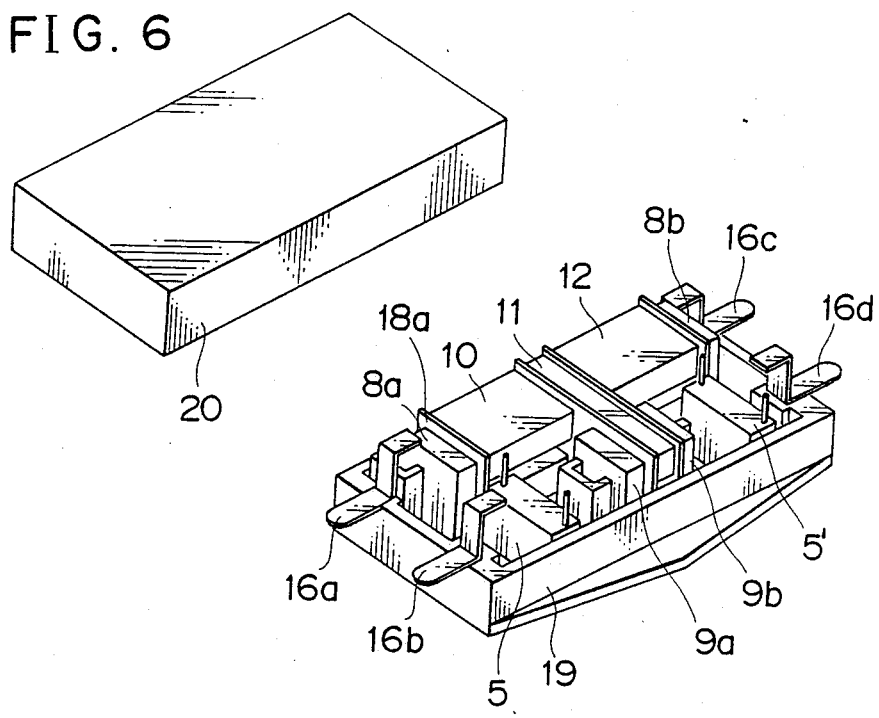
FIG. 6 is a perspective view of a specific model of the principle embodiment in FIG. 1.
Figure 7:
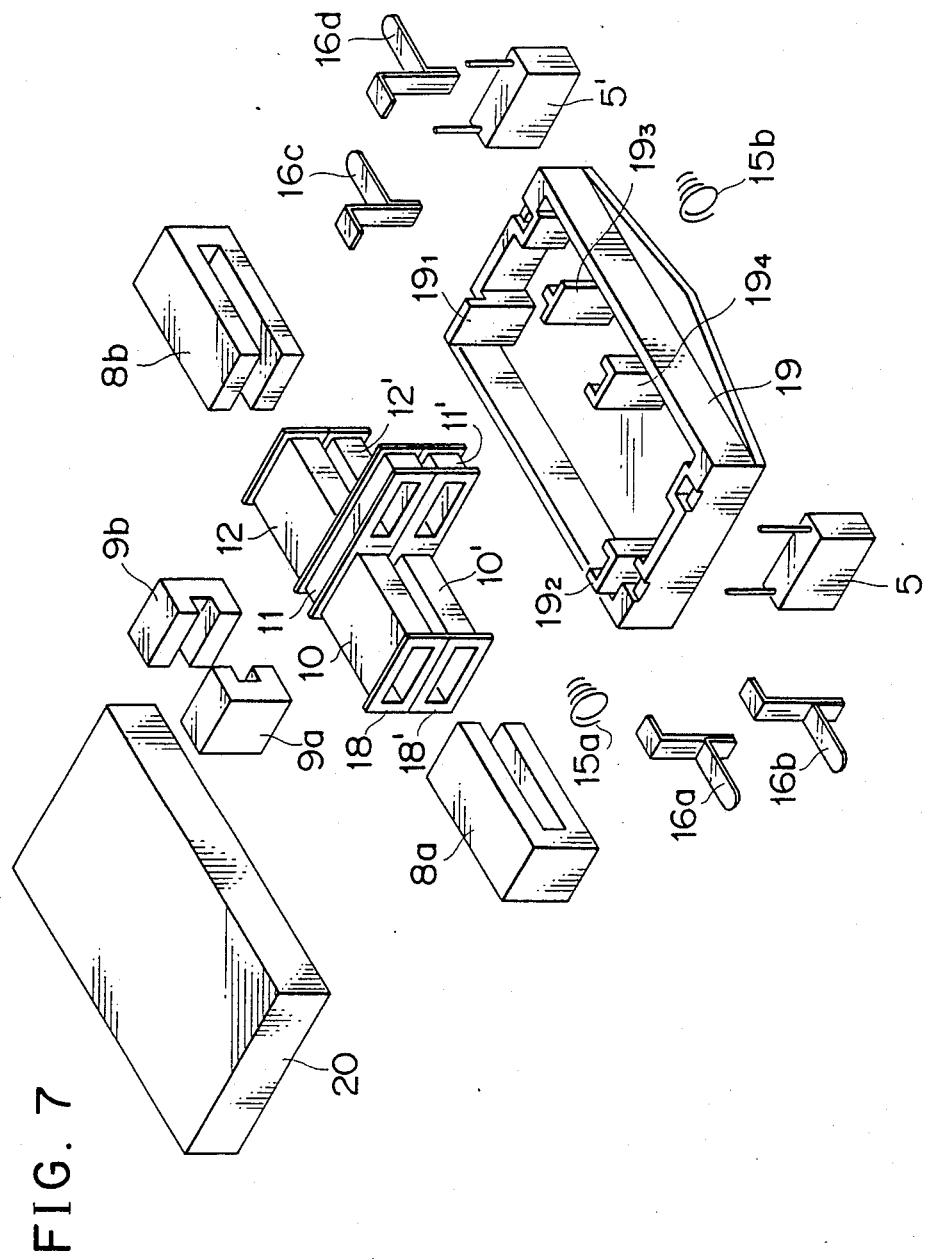
FIG. 7 is an exploded perspective view of the specific model in FIG. 6.

FIG. 6 is a perspective view of a specific assembled model of the embodiment shown in FIG. 4 and FIG. 7 is an exploded perspective view of FIG. 6.

In FIG. 6 and FIG. 7, the capacitor 5 is located adjacent a terminal 16b and is connected between a terminal 16a and the terminal 16b; and the capacitor 5' is located adjacent a terminal 16d and is connected between a terminal 16c l and the terminal 16d. The main core 8 is formed of two U-shaped cores 8a and 8b. The auxiliary core 9 is formed of two U-shaped cores 9a and 9b. The windings 10,10' and 12,12' are wound on bobbins 18,18' so that the windings are effectively wound around the main cores. The windings 11,11' are wound at locations opposite to each other so that these windings surround a portion of the main core and a portion of the auxiliary core simultaneously. Springs 15a,15b are to retain the cores. A base member 19 supports the entire assembly thereon. A case 20 accommodates the filter assembly therewithin.

In FIG. 7, the windings 10,10' are wound on the bobbins 18,18' having holes through which the main core 8a extends. also the windings 12,12' are wound on the bobbins having holes through which the main core 8b extends. Provided between these bobbins are another bobbins through which the main core 8 and the auxiliary core 9 extend and on which the windings 11,11' are wound.

As apparent from FIG. 6, the main cores 8a, 8b and the auxiliary cores 9a, 9b are inserted through the holes of these bobbins from both sides thereof to arrange an assembly, then the main core 8 is inserted into the base member 19 so that the main core 8 is located between a wall 19₁ of the base member 19 and a column 19₂ having a groove of a U-shaped cross section into which a spring 15a is inserted. Similarly, the auxiliary core 9 is inserted into the base member 19 so that the auxiliary core 9 is located between a column 19₃ provided on the base member 19 and a column 19₄ having a groove of a U-shaped cross section into which a spring 15b is inserted. In this manner, the assembly consisting of the main core, the auxiliary core, and the windings is fixed on the base member 19.

Then the terminals 16a, 16b, 16c, and 16d are inserted into recesses provided on the base member 19, while at the same time required wiring is made to electrically connect these terminals with the capacitors 5,5' disposed between the columns 19₃, 19₄ and the wall of the base member, respectively. Then attaching the case 20 completes the ac line filter.

With the aforementioned embodiment, the capacitors 5,5' may be accommodated within a space between the base member 19 and the columns 19₃, 19₄ which support the auxiliary cores 9a,9b; therefore this is advantageous to save part-mounting space.

Figure 8:
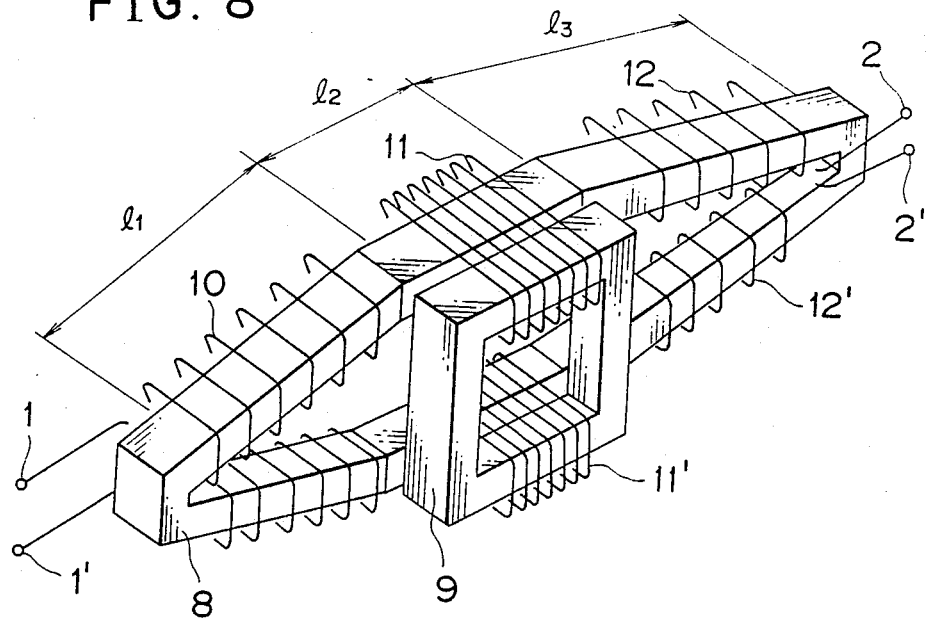
FIG. 8 and FIG. 9 are perspective views showing other embodiment of the invention.

FIG. 8 shows another embodiment of the invention. As apparent from FIG. 8, the main core 8 is shaped in the form of diamond and the auxiliary core 9 is placed over the main core 8 at the portion of a short axis thereof where distance between opposing magentic paths of the main core is the longest. Then the windings 11,11' are wound so that they surround the both cores simultaneously.

The windings 11,11' occupy the portions 12 where the distance between the opposing magnetic paths is the longest, thus a large number of turns may be wound thereon as compared to portions 11 and 13 before a winding on one path touches the winding on the other path. Thus even though the stray capcitances of the windings 11,11' increase due to the fact that these are closely wound and concentrated, an increase in the total series capacitance between the terminals will be minimized because the respective stray capacitances of the windings 12,12' and 10,10', which are spaced-windings, are made small. Consequently the noise rejection band may conveniently be extended to the low frequency region by virtue of the increased inductance resulted from the increased turns of the windings on the portion 12.

Although the embodiment has been described with a diamond-shaped main core 8, the same effect may also be obtained with a core of other shapes, for example, an elipse having a long axis and a short axis where the distance between opposing magnetic paths is maximum at the portions of the short axis.

Figure 9:
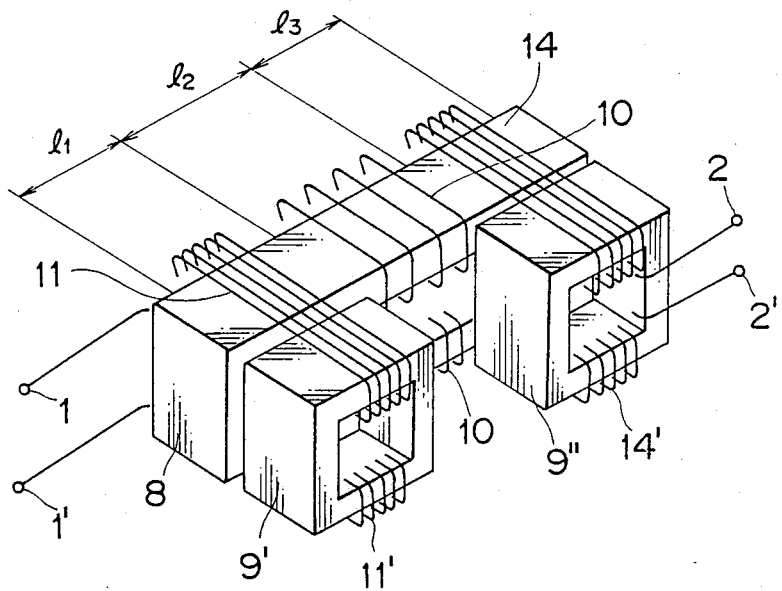

FIG. 9 shows another embodiment of the invention, which is provided with two auxiliary cores 9',9" on both sides of the main core 8. Desired wide band characteristics can be obtained, if required, by modifying the turns of the windings on the portions 11,12 and 13 and/or changing the effective permeability and dimensions of the main core 8 and the two auxiliary cores 9' 9". The windings are concentrated, as in the aforementioned embodiment, at the portions 11,13 where the windings are wound so that they simultaneously surround both the main core and the auxiliary core.

Figure 10:
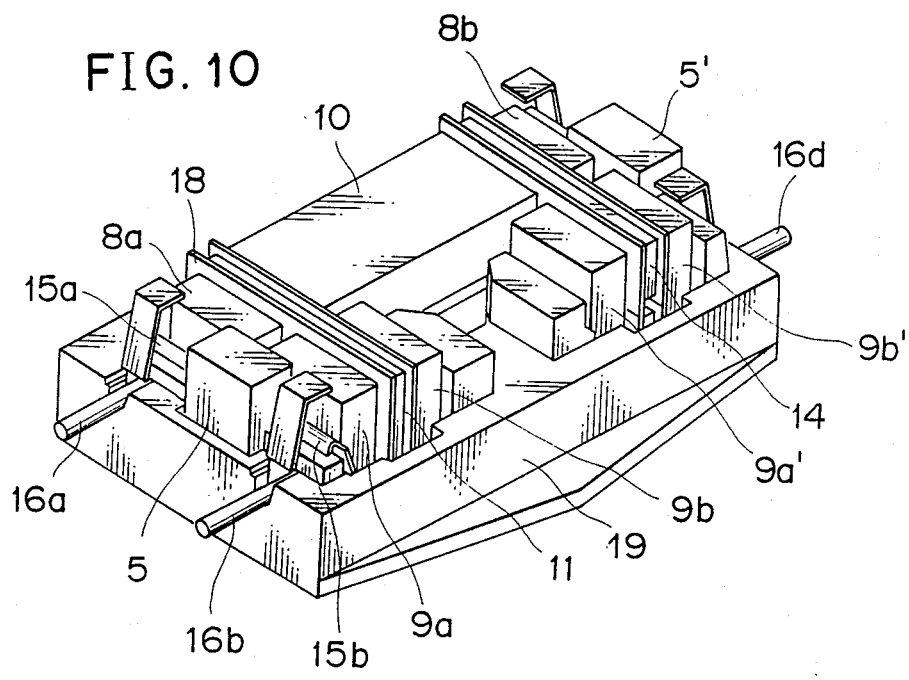
FIG. 10 is a perspective view of a specific model of the embodiment shown in FIG. 9.

FIG. 10 is a perspective assembly diagram of a specific embodied model of FIG. 9 and FIG. 11 is an exploded perspective view of FIG. 10.

The embodiment shown in FIG. 10 and FIG. 11 is different from that shown in FIG. 6 and FIG. 7 in that the concentrated windings 11,11' and 14,14' are disposed on both sides of the relatively spaced windings 10,10'. The auxiliary core 9a,9b,9a',9b', which are inserted into the concentrated windings 11,11',14,14', are inserted into the space between columns 19₅,19₆ provided on the base member 19 and a wall of the base member facing thereto. These cores are fixed firmly between the aforementioned columns and the wall of the base member 19 by forcibly inserting leaf springs 15a to 15c instead of the coil springs in FIG. 7.

For this purpose, recessed portions 19₇,19₈ are provided between the wall surface facing to the end portions of the main core 8 and the wall surface facing to the end portions of the auxiliary core 9 for housing the capacitors 5,5' because it is difficult to position the capacitors 5,5' between the auxiliary cores 9a,9b' and the walls of the base member 19 as in FIG. 6.

FIG. 12 and FIG. 13 are perspective views showing a disassembled construction of a closed magnetic path of the main core 8 of an embodiment different from those described above.

The construction shown in FIGS. 12 and 13 can also be applied to the auxiliary cores 9a,9b,9c, and 9d.

With an embodiment in FIG. 12, the L-shaped main cores 8a and 8b are supported firmly by springs 15e, 15f in sandwich relation as shown in FIG. 12a and FIG. 12b. With an embodiment in FIG. 13, the U-shaped main cores 8a and 8b are disposed in opposing relation be applied to the auxiliary cores 9a,9b,9c, and 9d.

With an embodiment in FIG. 12, the L-shaped main cores 8a and 8b are supported firmly by springs 15e, 15f in sandwich relation as shown in FIG. 12a and FIG. 12b. With an embodiment in FIG. 13, the U-shaped main cores 8a and 8b are disposed in opposing relation as shown in FIG. 13a. The strap portions 15g1,15g2,15h1,15h2 of leaf springs 15g,15h are inserted into engaging holes 21a1,21a2,21b1,21b2 of retaining plates 21a,21b made of electrically non-conductive material and then the strap portions are bent at their tip ends so that the main cores 8a and 8b are clamped together to be fixed firmly as shown in FIG. 12b.

Implementing the magnetic paths by these arrangements is advantageous in that mounting the core assembly after the cores have been inserted into the bobbins can be performed easily and reliably, and in that conductive components are not positioned near the respective coils 11,11',10,10' and 14,14' thus the stray capacitance Cs will not increase, thereby improving high frequency characteristics of the ac line filter at higher frequency region.

This embodiment permits design of a desired wide band characteristics, if required, by changing the dimensions of the three cores and the number of turns of the respective windings while using three cores having identical effective permeability can also implement a wide band ac line filter as compared to the prior art filters.

Figure 14:
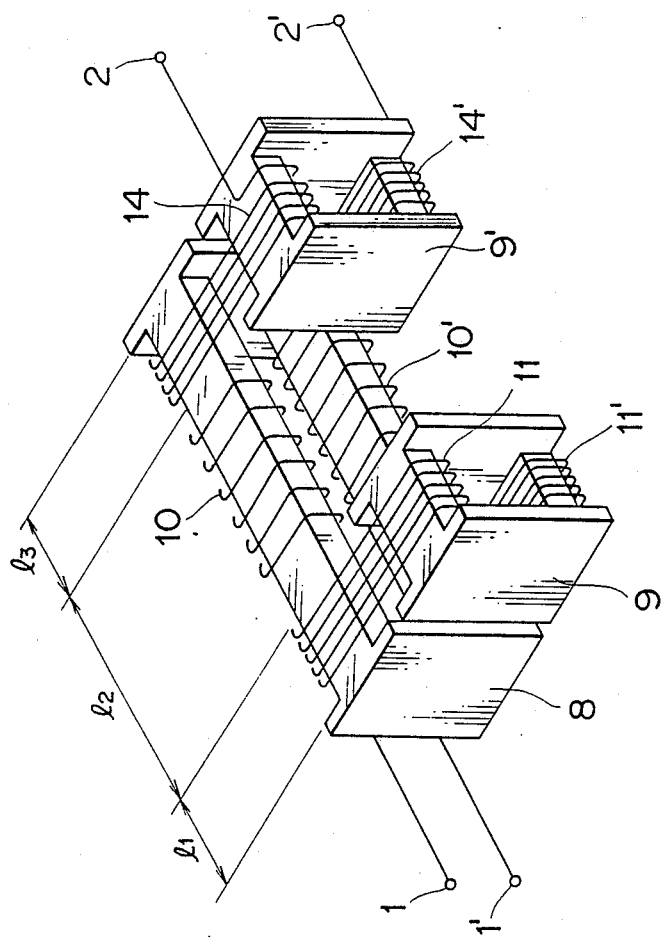
FIG. 14 is a diagram illstrating still other embodiment of the invention.
Figure 15:
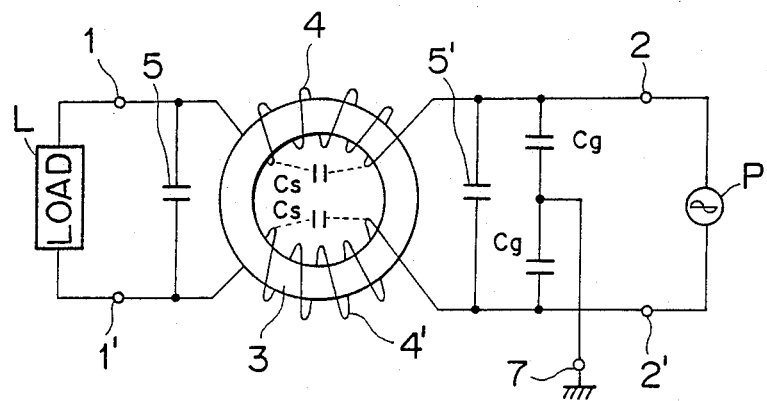
FIG. 15 is a diagram illustrating a prior art ac line filter.
Figure 16:
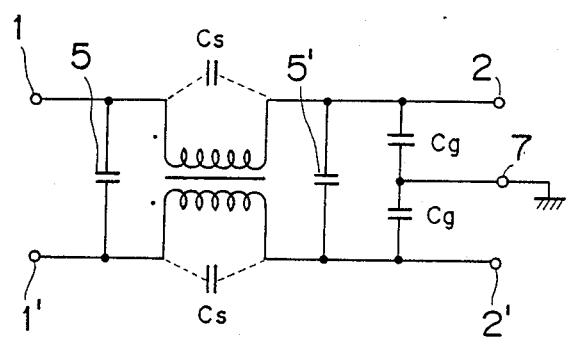
FIG. 16 is an equivalent circuit of FIG. 15.

FIG. 14 shows still another embodiment in which by arranging width of the magnetic paths to be wider at both ends of the main cores and also at both ends of the auxiliary cores that are not occuppied by the windings, thickness thereof is decreased without altering the cross sectional area of those portions of the magnetic paths. Thus short effective lengths of the main cores and the auxiliary cores may be obtained.

By this arrangement, the portions 11 and 13 may be made small thus the distance 12 between the cores 9,9' may be made long relative to the 11 or 13, and also the windings 11, 14 can be far away from each other. Thus the stray capacitances Cs between these windings will decrease, improving noise rejection characteristics at the higher frequency region.

While the invention has specifically been described by way of example of the preferred embodiment, these embodiments are only exemplary and various modifications may be made in the above described invention without departing from the scope thereof.

As thus far described, the present invention is of a type in which a main core and at least one auxiliary core form a composite type of core assembly, and windings are wound so that part of the windings are concentrated to surround both the main core and the auxiliary core. Thereby the rest of the windings may be wound in rather spaced fashion while also the distances between the respective input terminals and output terminals can be longer.

Thus the stray capacitances between the respective input and output terminals are reduced to improve the noise rejection characteristics at the high frequency region as well as the inductances are increased by providing the windings so that the windings surround botn the main core and the auxiliary core simultaneously for extending noise rejection characteristics to the low frequency region.

As mentioned, using the composite core assembly according to the present invention can extend the noise rejection characteristics to both the high frequency region and the low frequency region wihtout grounding. Thus the capacitor Cg for bypassing the noise current to the ground is no longer required, but the filter still providing good noise rejection performance over a wide frequency range even when the filter is used without grounding.

What is claimed is:
1. An ac line filter comprising:
   a pair of input terminals and a pair of output terminals;
   a main core for forming a closed magnetic path,
   at least one auxiliary core for forming a closed magnetic path shorter than that of said main core, opposing portions of said auxiliary core being disposed respectively beside said main core, said auxiliary core having an effective permeability at a low frequency region higher than that of the main core; and
   a pair of windings which are provided at opposing locations on said main core and which are wound in an opposite direction to each other, one of said pair of windings being connected between one of said pair of input terminals and one of said output terminals, the other of said pair windings being connected between the other of said input terminals and the other of said output terminals; wherein a winding portion of each of said pair of windings is provided to surround both said main core and said auxiliary core simultaneously and said winding portion is more concentrated that the rest of said winding.

2. An ac line filter according to claim 1, wherein said auxiliary core consists of two separate cores disposed with a distance therebetween.

3. An ac line filter according to claim 2, wherein the magnetic paths of said main core and said auxiliary core are formed wider at the ends portion thereof substantially free of said windings.

4. An ac line filter according to claim 1, wherein said main core comprises a long axis and a short axis, said long and short axes being orthogonal to one another, and wherein said magnetic path is symmetric with respect to said long axis.

5. An ac line filter according to claim 1, wherein said pair of windings provided on said main core are wound over a predetermined length of long sides of said main core.

6. An ac line filter according to claim 1, wherein a portion of each of said windings is wound in a concentrated manner around both said main core and said auxiliary core simultaneously.

7. An ac line filter according to claim 6, wherein the direction of said concentrated winding provides a magnetic flux within said cores in the same direction for common mode currents.

* * * * *